(12) United States Patent
Chang et al.

(10) Patent No.: US 8,274,065 B2
(45) Date of Patent: Sep. 25, 2012

(54) MEMORY AND METHOD OF FABRICATING THE SAME

(75) Inventors: Kuo-Pin Chang, Yuanli Township,Miaoli County (TW); Erh-Kun Lai, Taichung County (TW)

(73) Assignee: Macronix International Co., Ltd., Hsinchu (TW)

( * ) Notice: Subject to any disclaimer, the term of this patent is extended or adjusted under 35 U.S.C. 154(b) by 466 days.

(21) Appl. No.: 12/581,219

(22) Filed: Oct. 19, 2009

(65) Prior Publication Data
US 2011/0089393 A1    Apr. 21, 2011

(51) Int. Cl.
*H01L 29/10* (2006.01)
*H01L 21/00* (2006.01)

(52) U.S. Cl. ........ 257/4; 257/43; 257/E45.003; 257/E21.001; 438/104; 438/754; 365/148

(58) Field of Classification Search ................. 257/2, 4, 257/43, E21.001, E45.003; 365/148; 438/104, 438/754, 768
See application file for complete search history.

(56) References Cited

U.S. PATENT DOCUMENTS

| 7,697,316 | B2* | 4/2010 | Lai et al. | 365/148 |
| 7,791,923 | B2* | 9/2010 | Baek et al. | 365/148 |
| 7,812,404 | B2* | 10/2010 | Herner et al. | 257/390 |
| 2004/0160820 | A1* | 8/2004 | Rinerson et al. | 365/171 |
| 2007/0045704 | A1* | 3/2007 | Ufert | 257/314 |

* cited by examiner

*Primary Examiner* — Tuan N. Quach
(74) *Attorney, Agent, or Firm* — Thomas|Kayden

(57) ABSTRACT

A memory, comprising a metal portion, a first metal layer and second metal oxide layer is provided. The first metal oxide layer is on the metal portion, and the first metal oxide layer includes N resistance levels. The second metal oxide layer is on the first metal oxide layer, and the second metal oxide layer includes M resistance levels. The memory has X resistance levels and X is less than the summation of M and N, for minimizing a programming disturbance.

22 Claims, 4 Drawing Sheets

MEMORY AND METHOD OF FABRICATING THE SAME

BACKGROUND OF THE INVENTION

1. Field of the Invention

The invention relates in general to a memory and a method of fabricating the same, and more particularly to a memory having two metal oxide layers and a method of fabricating the same.

2. Description of the Related Art

Integrated circuits are used to control the functions of many modern electronic devices. Memory devices used for storing (write) and retrieving (read) data possess advantages that are easily accessible by the integrated circuits. Various types of memory devices for data storage are known in the art. Generally, memory devices are distinguished by their speed and data retention characteristic.

Memory device falls mainly into two classes: random access memory ("RAM") and read-only memory ("ROM"). Many improvements and variations of RAMs and ROMs have been advanced to further their performance, and both types of memory have their own advantages and disadvantages. Typically, RAM (i.e. volatile) has fast data transfer rates and efficient writing architectures, but requires continuously power to keep the data. ROM retains the contents even in the absence of power, but is limited in the speed, the number of times to which it may be written, and the manner in which it may be written. ROM mostly comprises Flash memory, EPROM, OTP, EEPROM, and PROM. RAM mostly comprises static RAM (SRAM), dynamic RAM (DRAM).

Static random access memory (SRAM), with very fast access times, retains a value as long as power is supplied. However, its volatility (i.e. it will lose its contents when the power is switched off), large size and stand-by current limit the total size and applications of the memory. DRAM has the smallest cell size, but necessitates a complex refresh algorithm, and is also necessary to supply voltage at all times or the information will disappear (i.e. volatile). Flash memory (i.e. non-volatile memory) is slower to program, and in some cases must erase a large block of memory before being reprogrammed.

Resistive random access memory (RRAM) is a new non-volatile memory type being developed by many companies for a period of time. Different forms of RRAM have been disclosed, based on different dielectric materials, spanning from perovskites to transition metal oxides to chalcogenides. Literature data are giving more indications that RRAM is closest to becoming a universal memory. For, example, RRAM operates at a faster timescale (switching time can be less than 10 ns), and has a simpler, smaller cell structure (a 4-8 $F^2$ MIM stack). Compared to flash memory, a lower voltage is sufficient. Compared to DRAM, the data is retained longer (10 years).

Memory devices can be constructed into two-dimensional (2D) cell array or three-dimensional (3D) memory array, wherein the 2D memory cells are matrixed in the X-Y plane. The 3D memory device includes a plurality of stacked memory cells to form a three-dimensional memory array, and it can be applied to multi-level operation after properly designed. FIG. 1 shows a three-dimensional memory device capable of being applied to multi-level operation. Referring to FIG. 1, the three-dimensional memory device 10 includes three vertically stacked structures 21, 22, and 23. Each of the stacked structures includes electrodes 11, plug 12 and metal oxide layer 13 and fabricated by COA/VIA1/VIA2 process sequentially. Accordingly, more steps and cost is needed to fabricate the 3D memory device 10. More risks caused by complicated steps are also introduced in fabrication.

SUMMARY OF THE INVENTION

A memory and a method of fabricating the same are described herein. The memory has at least two metal oxide layers. The resistance of the memory equals the sum of the individual resistance of these two metal oxide layers, and a window between the initial resistance and maximum resistance is enlarged. It therefore allows to be applied for the multi-level operation or multi-bits operation. In addition, one or two additional steps will be added to the conventional method of fabricating the memory, as a result of low cost and simple process.

A memory is provided. The memory element comprises a metal portion, first metal oxide layer and second metal oxide layer. The first metal oxide layer is on the metal portion, and the first metal oxide layer includes N resistance levels. The second metal oxide layer is on the first metal oxide layer, and the second metal oxide layer includes M resistance levels. The memory has X resistance levels and X is less than the summation of M and N, for minimizing a programming disturbance.

A method of fabricating a memory is provided. The method comprises: (a) providing a metal portion; (b) forming a first metal oxide layer on the metal portion, the first metal oxide layer including N resistance levels; and (c) forming a second metal oxide layer on the first metal oxide layer, the second metal oxide layer including M resistance levels, wherein the memory has X resistance levels and X is less than the summation of M and N, for minimizing a programming disturbance.

A memory is provided. The memory comprises a metal portion, first metal oxide layer and second metal oxide layer. The first metal oxide layer is formed on the metal portion. The oxygen ratio of the metal oxide at the top of the first metal oxide layer is the highest and gradually decreased as it goes downward the bottom thereof. The second metal oxide layer is on the first metal oxide layer. The oxygen ratio of the metal oxide at the top of the second metal oxide layer is the highest and gradually decreased as it goes downward the bottom thereof.

A method of fabricating a memory is provided. The method comprises: (a) providing a metal portion; (b) forming a first metal oxide layer on the metal portion, the oxygen ratio of the metal oxide at the top of the first metal oxide layer being the highest and gradually decreased as it goes downward the bottom thereof; and (c) forming a second metal oxide layer on the first metal oxide layer, the oxygen ratio of the metal oxide at the top of the second metal oxide layer being the highest and gradually decreased as it goes downward the bottom thereof.

The invention will become apparent from the following detailed description of the preferred but non-limiting embodiments. The following description is made with reference to the accompanying drawings.

DETAILED DESCRIPTION OF THE INVENTION

In the present embodiment, a memory and a method of fabricating the same are disclosed. The memory has two or more metal oxide layers (e.g. first and second metal oxide layers) stacked together. The first metal oxide layer and the second metal oxide layer have an electrical-graded property characterized by a plurality of resistance levels. According to the present embodiment, a structure of the memory capable of applying to multi-level operation or multi-bits operation is disclosed and fabricated by a simple and low-cost method. The embodiments disclosed herein are used for illustrating the invention, but not for limiting the scope of the invention.

The memory of the present disclosure comprises a metal portion, first metal oxide layer and second metal oxide layer. The first metal oxide layer is formed on the metal portion, and the first metal oxide layer includes N resistance levels. The second metal oxide layer is on the first metal oxide layer, and the second metal oxide layer includes M resistance levels. The memory has X resistance levels and X is less than the summation of M and N, for minimizing a programming disturbance. Moreover, some basic techniques, such as formation of bottom electrode, top electrode, etching, oxide deposition, metal oxidation, etc., are known by one skilled in the field of the invention and won't be illustrated in detail. Also, it is known for people skill in the art that the memory presented in the embodiments and drawings could be slightly modified under the spirit of the invention. The specification and the drawings are to be regard as an illustrative sense rather than a restrictive sense. Additionally, the drawings used for illustrating the embodiments and applications only show the major characteristic parts in order to avoid obscureness.

Figure 1:
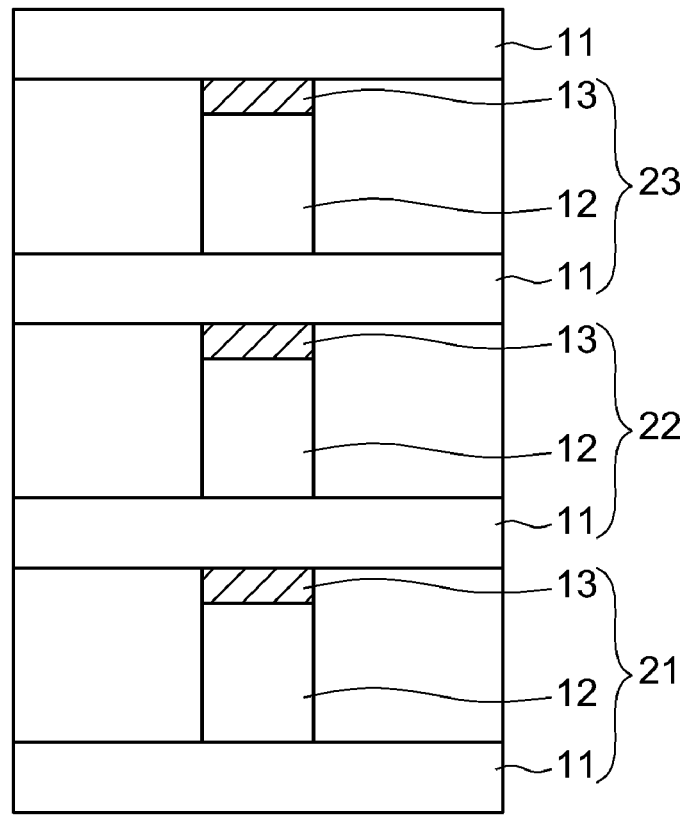
FIG. 1 (related art) shows a three-dimensional memory device capable of being applied to multi-level operation.
Figure 2:
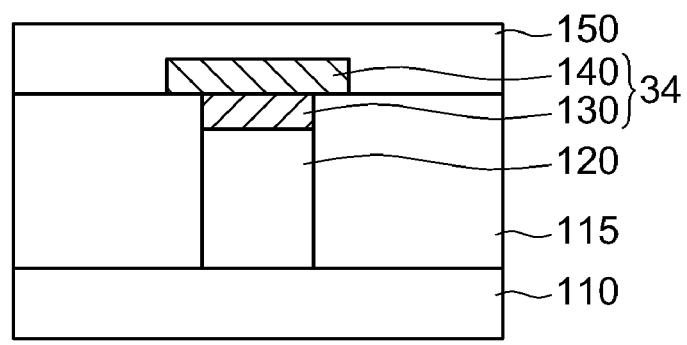
FIG. 2 schematically shows a cross-sectional view of a memory according to the first embodiment.

FIG. 2 schematically shows a cross-sectional view of a memory according to the first embodiment. As shown in FIG. 2, the memory cell 100 comprises a bottom electrode 110, a memory element 234 and a top electrode 150. The memory element 234 contacts with the bottom electrode 110 and extends through a dielectric layer 115 to the top electrode 150. The memory element 234 includes a metal portion 120 and a memory portion 34. The metal portion 120 is formed on the bottom electrode 110, and the memory portion 34 is formed on the metal portion 120. The memory portion 34 includes a first metal oxide layer 130 on the metal portion 120 and a second metal oxide layer 140 on the first metal oxide layer 130. The top electrode 150 is formed on the memory element 234. The bottom and top electrodes 110 and 150 are each coupled to additional elements (not shown) such as access devices and bit lines.

The first metal oxide element and the second metal oxide element have an electrical-graded property characterized by a plurality of resistance levels. The first metal oxide element includes a plurality of resistance levels. The levels are from 1 to N and N is at least 2. The second metal oxide element includes a plurality of resistance levels. The levels are from 1 to M and M is at least 2.

The first metal oxide layer 130 and the second metal oxide layer 140 independently include tungsten oxide ($WO_x$), nickel oxide ($NiO_x$), niobium oxide ($NbO_x$), copper oxide ($CuO_x$), tantalum oxide ($TaO_x$), aluminum oxide ($AlO_x$), cobalt oxide ($CoO_x$), ferric oxide ($FeO_x$), hafnium oxide ($HfO_x$), titanium oxide ($TiO_x$), strontium oxide ($SrO_x$), zirconate oxide ($ZrO_x$), barium oxide ($BaO_x$), germanium oxide ($GeO_x$), tin oxide ($SnO_x$), manganese oxide ($MnO_x$), tellurium oxide ($TeO_x$), antimony oxide ($SbO_x$), praseodymium oxide ($PrO_x$), calcium oxide ($CaO_x$), molybdenum oxide ($MoO_x$), tungsten silicon oxide ($WSixOy$), silicon oxide ($SiOx$) the like or the combination thereof. The composition of the first metal oxide layer 130 can be the equal to or different from that of the second metal oxide layer 140.

The metal oxide layer includes one or more metal oxide compounds, each of which are distributed unevenly. The oxygen ratio of the metal oxide at the top is the highest and gradually decreased as it goes downward the bottom thereof. For example, the first metal oxide layer 130 includes tungsten oxide (WOx); that is, the first metal oxide layer 130 may includes $WO_3$, $W_2O_5$ and $WO_2$, and the concentration and distribution of these oxides may be different from each other.

Figure 3A:
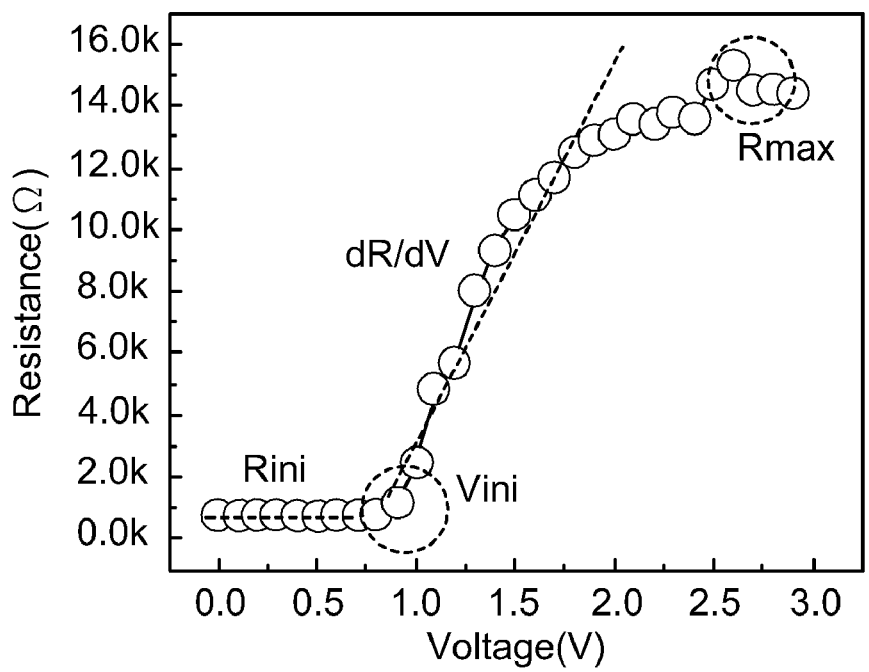
FIG. 3A shows the relation of the resistance and voltage applied to a metal oxide layer.
Figure 3B:
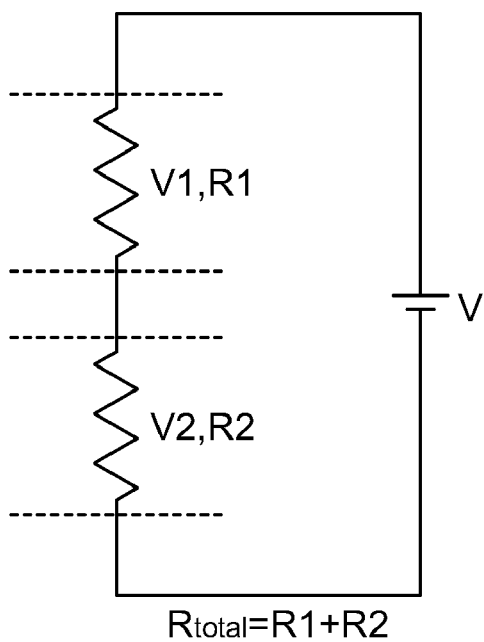
FIG. 3B shows electric circuit of the memory according to the preferred embodiment.

FIG. 3A shows the relation of the resistance and voltage applied to a metal oxide layer, and FIG. 3B shows electric circuit of the memory according to the preferred embodiment. As the metal oxide layer is formed into graded state, resistance of each layer will gradually vary with voltage and/or pulse width (referring to FIG. 3A). The R-V characteristics of the graded metal oxide layer includes initiate resistance, initial voltage that begins to switch the initial resistance to high resistance state, maximum resistance, the rate that resistance varied with voltage, and breakdown voltage of the graded metal oxide layer. The R-V characteristics of each graded metal oxide layer can be tuned by material, area, oxidation time, operating method and etc., so as to satisfy the various need of designed products. The material of the graded metal oxide layer determines the basic R-V characteristics. The oxidation time determines the proportion of metal oxide compounds.

While the memory 100 is applied a voltage of V, the across voltages upon the first and second metal oxide layers 130 and 140 are V1 and V2 respectively, as shown in FIG. 3B. The resistances of the first and second metal oxide layers 130 and 140 corresponding to the voltage across the memory 100 are R1 and R2 respectively. The resistance $R_{TOTAL}$ of the memory 100 therefore equals to the sum of the resistances of the first and second metal oxide layers 130 and 140, and remains the characteristic of gradually variation. Accordingly, resistance is increased and the resistive window of each levels is enlarged. When the memory 100 of the present embodiment is applied to multi-level cell (MLC) or multi-bits cell (MBC) operation, it allows to improve the reliability in MLC application or MBC application. Moreover, more metal oxide layer can be stacked between the top and bottom electrodes, as result of more increased resistance and enlarged resistive window between each levels.

In operation, voltages applied to the top and bottom electrodes 150 and 110 will cause current to flow between the top and bottom electrodes 150 and 110 via the memory element 234 and induce a programmable change in electrical resistance of the memory portion 34 (i.e. the first metal oxide layer 130 and the second metal oxide layer 140), the electrical resistance indicating a data value stored in the memory cell 10. In some embodiments the memory portion 34 of the memory cell 100 can store two or more bits of data.

Figure 4A:
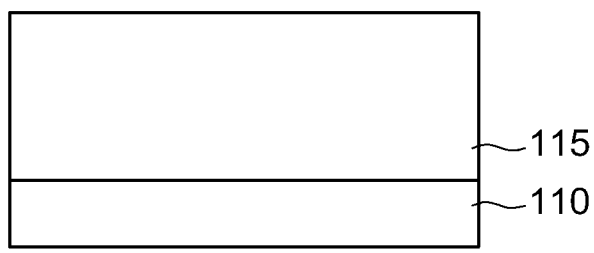
FIG. 4A~4F schematically illustrates a method of fabricating a memory according to the preferred embodiment.
Figure 4B:
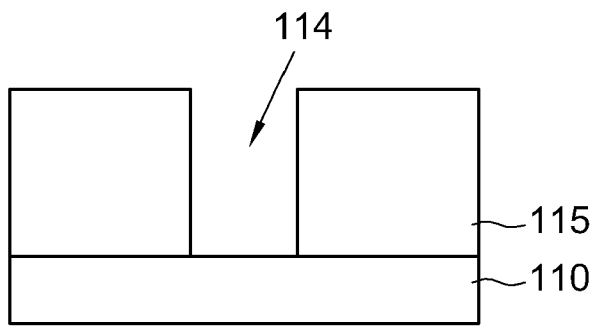

The memory 100 of the present embodiment can be fabricated in various ways, one of which is described below. FIG. 4A~4F schematically illustrates a method of fabricating a memory according to the preferred embodiment. Firstly, a bottom electrode 110 is provided, and a dielectric layer 115 is deposited on the bottom electrode 110 as shown in FIG. 4A. A part of the dielectric layer 115 is than etched, and a via 114 is formed in the dielectric layer 115 to expose the top surface of the bottom electrode 110, as shown in FIG. 4B.

Figure 4C:
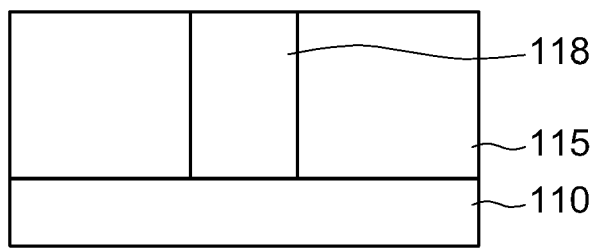

Next, a metal layer 122 fills in the via 114, resulting in the structure shown in FIG. 4C. The metal layer 118 can be formed by depositing metal material in the via 114, for example by using Chemical Vapor Deposition (CVD), and preferably followed by a planarizing step such as Chemical Mechanical Polishing (CMP). The metal layer 118 includes tungsten (W), nickel (Ni), niobium (Nb), copper (Cu), tantalum (Ta), aluminum (Al), cobalt (Co), ferric (Fe), hafnium (Hf), titanium (Ti), strontium (Sr), zirconate (Zr), barium (Ba), germanium (Ge), tin (Sn), manganese (Mn), antimony (Sb), tellurium (Te), praseodymium (Pr), calcium (Ca), molybdenum (Mo), silicon (Si) the like or the combination thereof.

Figure 4D:
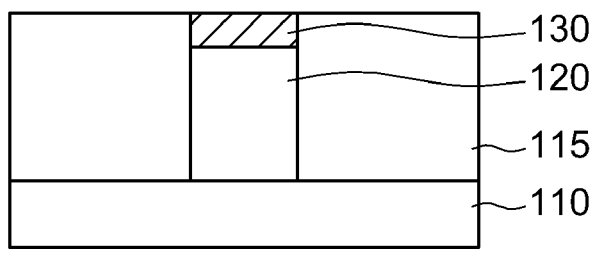

Afterwards, oxidation of a portion of the metal layer 118, resulting in the structure shown in FIG. 4D. The metal layer 118 is therefore divided into two portions after this step; the oxidized portion of the metal layer 118 is first metal oxide layer 130 the of memory element (234 of FIG. 2), and the other portion of the metal layer 118 is the metal portion 120 of the memory element (234 of FIG. 2). Further, the oxidation can be performed by a plasma oxidation step and an optional thermal oxidation step. Plasma oxidation used to form the first metal oxide layer 130 can result in a graded metal oxide, having concentrations of metal-oxygen compounds that have a distribution that varies with distance from the top surface of the first metal oxide layer 130. When the metal layer 118 includes tungsten, the first metal oxide layer includes tungsten oxide ($WO_x$) having concentrations of tungsten-oxygen compounds that have a distribution that varies with distance from the top surface of the first metal oxide layer 130. The depth profile of tungsten oxide is detected by X-Ray Photoelectron Spectroscopy (XPS). Table 1 shows depth profile of WOx in the first metal oxide layer. Preferably, $WO_3$ dominates near the top surface of the first metal oxide layer 130 while multiple compounds, including $WO_3$, $W_2O_5$, $WO_2$, are in deeper regions. At the top surface of the first metal oxide layer, $WO_3$ and $W_2O_5$ are about 20% and 80% of the metal oxide respectively, but $WO_2$ and tungsten are absent. As it goes downward the bottom, the proportion of high oxygen-ratio compound, e.g., $WO_3$, gradually decreases, and that of low oxygen-ratio compound, e.g., $WO_2$ or $W_2O_5$, gradually increases. $WO_3$, $W_2O_5$, $WO_2$ and W are about 28%, 20%, 34% and 18% of the metal oxide respectively at the middle of the first metal oxide layer. At the bottom of the first metal oxide layer, $WO_2$ and tungsten are about 74% and 26% of the metal oxide respectively, but $WO_3$ and $W_2O_5$ are absent. The plasma oxidation used to form the first metal oxide layer 130 produces both monotonically decreasing ion valence values ($W^{+6}$, $W^{+5}$, $W^{+4}$, and $W^0$), as well as lower oxygen content in deeper layers. As shown in table 1, the first metal layer remains large amount of oxygen vacancies from surface to 120 A.

Table. 1 shows depth profile of tungsten oxide in the first metal oxide layer.

| Depth (A) | W (%) | $WO_2$ (%) | $W_2O_5$ (%) | $WO_3$ (%) |
|---|---|---|---|---|
| 0 | — | — | 20 | 80 |
| 10 | — | 13 | 38 | 49 |
| 20 | 12 | 19 | 38 | 31 |
| 30 | 13 | 31 | 26 | 31 |
| 40 | 15 | 29 | 27 | 29 |
| 50 | 17 | 32 | 23 | 28 |
| 60 | 18 | 34 | 20 | 28 |
| 70 | 19 | 34 | 20 | 27 |
| 80 | 21 | 34 | 20 | 25 |
| 100 | 35 | 23 | 23 | 20 |
| 120 | 74 | 26 | — | — |

Figure 4E:
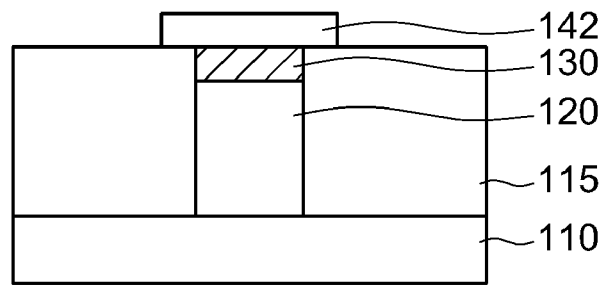
Figure 4F:
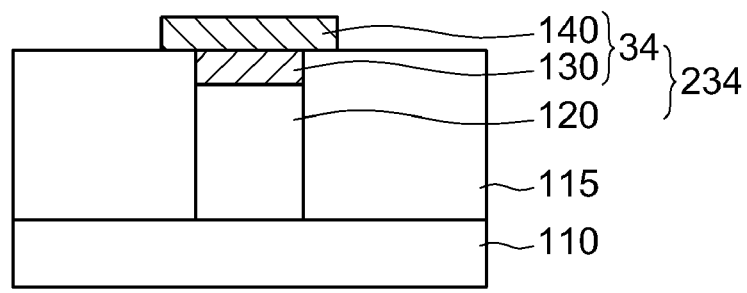

Then, another metal layer 142 is formed on the first metal oxide layer 130 and the dielectric layer 115, and then patterned and etched as shown in FIG. 4E. Similarly, the metal layer 142 includes tungsten (W), nickel (Ni), niobium (Nb), copper (Cu), tantalum (Ta), aluminum (Al), cobalt (Co), ferric (Fe), hafnium (Hf), titanium (Ti), strontium (Sr), zirconate (Zr), barium (Ba), germanium (Ge), tin (Sn), manganese (Mn), antimony (Sb), tellurium (Te), praseodymium (Pr), calcium (Ca), molybdenum (Mo), silicon (Si) the like or the combination thereof. Afterwards, oxidation of the metal layer 142, resulting in the structure shown in FIG. 4F. The oxidation can be performed by a plasma oxidation step and an optional thermal oxidation step. Plasma oxidation used to form the second metal oxide layer 140 can result in a graded metal oxide, having concentrations of metal-oxygen compounds that have a distribution that varies with distance from the top surface of the first metal oxide layer 140. The memory element (234 in FIG. 2) including the metal portion 120 and the memory portion 34 (i.e. the first and second metal oxide layer 130 and 140) is so far completed.

Finally, a top electrode 150 is formed on the memory element (234 in FIG. 2), resulting in the memory cell 100 illustrated in FIG. 2. The top electrode 150 in some embodiments comprising a portion of a bit line. In one embodiment the top electrode 150 comprises a multi-layer stacked on the memory element 234.

One of the preferred embodiments is provided for demonstrating the memory. The embodiment disclosed herein is used for illustrating the invention, but not for limiting the scope of the invention.

Figure 5:
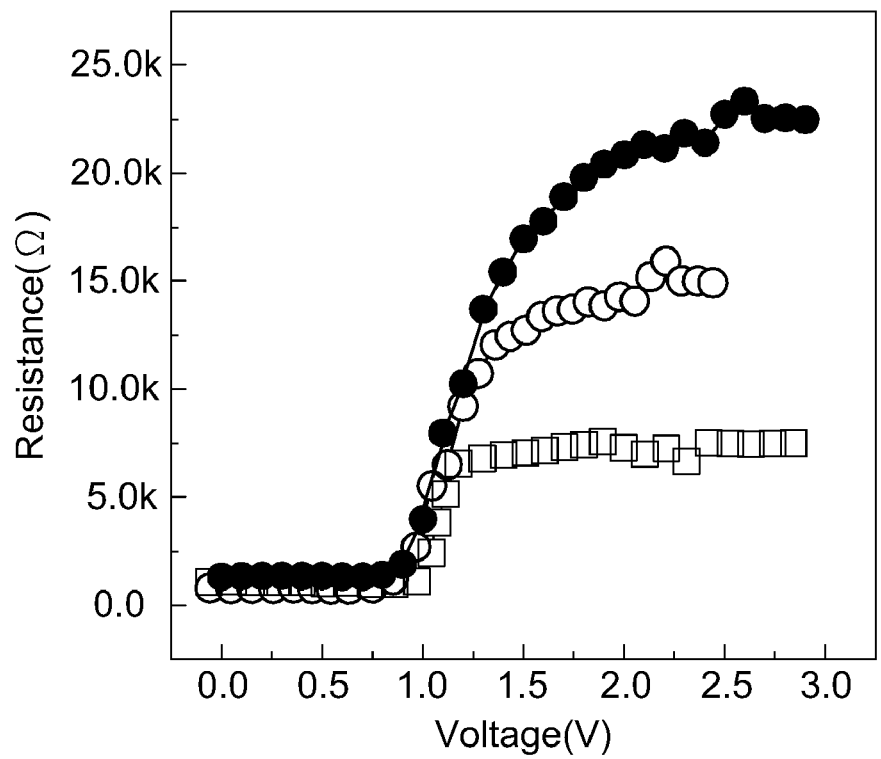
FIG. 5 shows the relation of the resistance and voltage applied to the first metal oxide layer, the second metal oxide layer and the memory cell respectively according to the preferred embodiment.

In the present embodiment, the bottom electrode is made of TiN/Al/TiN, the metal plug is made of tungsten oxide, and the top electrode is made of TiN/Al/TiN. The first metal oxide layer is fabricated by plasma oxidation, in which the gas flow ranges from 3:1 of $O_2/N_2$ ratio to $O_2$ only, preferably 20:1 of $O_2/N_2$ ratio, and the oxidation time ranges from 100 to 2000 seconds, preferably 400 seconds. If the valve to $N_2$ source is turned off, only $O_2$ is supplied during the plasma oxidation. The second metal oxide layer is fabricated by the same condition as the first metal oxide layer. The area of the first metal oxide layer ranges from $4 \times 10^{-4}$ μm² to 1 μm², preferably 0.08 μm². The area of the second metal oxide ranges from $4 \times 10^{-4}$ μm² to 1 μm², preferably 0.15 μm². The R-V characteristic of the first metal oxide layer is indicated by broken line with white dots as shown in FIG. 5. The R-V characteristic of the second metal oxide layer is indicated by broken line with white cube as shown in FIG. 5. The R-V characteristic of the memory 100 is the sum of that of the first and second metal oxide layer 130 and 140 is indicated by real line with black dots as shown in FIG. 5. Each metal oxide shows the different dependence in resistance and voltage, so stacked metal oxide layers combined these properties increase the resistive window between levels.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory, comprising:
a metal portion;
a first metal oxide layer on the metal portion, the first metal oxide layer including N resistance levels; and
a second metal oxide layer on the first metal oxide layer, the second metal oxide layer including M resistance levels, wherein the memory has X resistance levels and X is less than the summation of M and N, for minimizing a programming disturbance.

2. The memory according to claim 1, further comprising:
a bottom electrode formed underneath the metal portion;
a top electrode formed on the second metal oxide layer; and
an dielectric layer, formed on the bottom electrode and surrounding the metal portion and the first metal oxide layer.

3. The memory according to claim 1, wherein the first metal oxide layer and the second metal oxide layer independently comprise tungsten oxide ($WO_x$), nickel oxide ($NiO_x$), niobium oxide ($NbO_x$), copper oxide ($CuO_x$), tantalum oxide ($TaO_x$), aluminum oxide ($AlO_x$), cobalt oxide ($CoO_x$), ferric oxide ($FeO_x$), hafnium oxide ($HfO_x$), titanium oxide ($TiO_x$), strontium oxide ($SrO_x$), zirconate oxide($ZrO_x$), barium oxide ($BaO_x$), germanium oxide ($GeO_x$), tin oxide ($SnO_x$), manganese oxide ($MnO_x$), tellurium oxide($TeO_x$), antimony oxide ($SbO_x$), praseodymium oxide ($PrO_x$), calcium oxide ($CaO_x$), molybdenum oxide ($MoO_x$), tungsten silicon oxide ($WSixOy$), silicon oxide ($SiOx$), or the combination thereof.

4. The memory according to claim 1, wherein N is at least 2, and M is at least 2.

5. A method of forming a memory, comprising:
providing a metal portion;
forming a first metal oxide layer on the metal portion, the first metal oxide layer including N resistance levels; and
forming a second metal oxide layer on the first metal oxide layer, the second metal oxide layer including M resistance levels, wherein the memory has X resistance levels and X is less than the summation of M and N, for minimizing a programming disturbance.

6. The method according to claim 5 further comprising:
forming a bottom electrode;
forming a dielectric layer on the substrate;
etching the dielectric layer to form a via, wherein a metal layer fills in the via to form the metal portion; and
forming a top electrode on the second metal oxide layer.

7. The method according to claim 6, wherein the step of forming a first metal oxide layer comprises:
oxidizing a portion of the metal layer.

8. The method according to claim 7, wherein the step of oxidizing the portion of the metal layer is performed by an plasma oxidation.

9. The method according to claim 8, wherein the gas flow is more than 3:1 of $O_2/N_2$ ratio.

10. The method according to claim 8, wherein the oxidation time ranges from 100 to 2000 seconds.

11. The method according to claim 5, wherein the metal portion comprises tungsten (W), nickel (Ni), niobium (Nb), copper (Cu), tantalum (Ta), aluminum (Al), cobalt (Co), ferric (Fe), hafnium (Hf), titanium (Ti), strontium (Sr), zirconate (Zr), barium (Ba), germanium (Ge), tin (Sn), manganese (Mn), antimony (Sb), tellurium (Te), praseodymium (Pr), calcium (Ca), molybdenum (Mo), silicon (Si), the like or the combination thereof.

12. The method according to claim 5, wherein the area of the first metal oxide layer ranges from $4 \times 10^{-4}$ $\mu m^2$ to 1 $\mu m^2$.

13. The method according to claim 5, wherein the step of forming the second metal oxide layer comprising;
forming a metal layer on the first metal oxide layer and the dielectric layer; and
oxidizing the metal layer to form the second metal oxide layer.

14. The method according to claim 13, wherein the step of oxidizing the portion of the metal layer is performed by plasma oxidation.

15. The method according to claim 14, wherein the gas flow is more than 3:1 of $O_2/N_2$ ratio.

16. The method according to claim 14, wherein the oxidation time ranges from 100 to 2000 seconds.

17. The method according to claim 13, wherein the metal layer comprises tungsten (W), nickel (Ni), niobium (Nb), copper (Cu), tantalum (Ta), aluminum (Al), cobalt (Co), ferric (Fe), hafnium (Hf), titanium (Ti), strontium (Sr), zirconate (Zr), barium (Ba), germanium (Ge), tin (Sn), manganese (Mn), antimony (Sb), tellurium (Te), praseodymium (Pr), calcium (Ca), molybdenum (Mo), silicon (Si), or the combination thereof.

18. The method according to claim 13, wherein the area of the second metal oxide layer ranges from $4 \times 10^{-4}$ $\mu m^2$ to 1 $\mu m^2$.

19. A memory, comprising:
a metal portion;
a first metal oxide layer on the metal portion, the oxygen ratio of the metal oxide at the top of the first metal oxide layer being the highest and gradually decreased as it goes downward the bottom thereof; and
a second metal oxide layer on the first metal oxide layer, the oxygen ratio of the metal oxide at the top of the second metal oxide layer being the highest and gradually decreased as it goes downward the bottom thereof.

20. The memory according to claim 19, wherein $WO_3$ and $W_2O_5$ are about 20% and 80% of the metal oxide respectively at the top surface of the first metal oxide layer.

21. The memory according to claim 19, wherein $WO_3$, $W_2O_5$, $WO_2$ and W are about 28%, 20%, 34% and 18% of the metal oxide respectively at the middle of the first metal oxide layer.

22. The memory according to claim 19, wherein $WO_2$ and tungsten are about 74% and 26% of the metal oxide respectively at the bottom of the first metal oxide layer.

* * * * *